(12) United States Patent
Stamer

(10) Patent No.: US 10,089,859 B2
(45) Date of Patent: Oct. 2, 2018

(54) METHOD AND DEVICE FOR MEASURING A LINE RESISTANCE OF CONTROL LINES IN HAZARD WARNING AND CONTROL SYSTEMS

(71) Applicant: Minimax GmbH & Co. KG, Bad Oldesloe (DE)

(72) Inventor: Arne Stamer, Siebenbaeumen (DE)

(73) Assignee: Minimax GmbH & Co. KG, Bad Oldesloe (DE)

( * ) Notice: Subject to any disclaimer, the term of this patent is extended or adjusted under 35 U.S.C. 154(b) by 342 days.

(21) Appl. No.: 14/889,364

(22) PCT Filed: May 9, 2014

(86) PCT No.: PCT/EP2014/059550
§ 371 (c)(1),
(2) Date: Jan. 29, 2016

(87) PCT Pub. No.: WO2014/184107
PCT Pub. Date: Nov. 20, 2014

(65) Prior Publication Data
US 2016/0140836 A1    May 19, 2016

(30) Foreign Application Priority Data
May 17, 2013 (EP) ................................ 13168203

(51) Int. Cl.
*G01R 31/02* (2006.01)
*G08B 29/12* (2006.01)
(Continued)

(52) U.S. Cl.
CPC ......... *G08B 29/123* (2013.01); *G01R 31/024* (2013.01); *H02M 1/00* (2013.01); *H02P 1/00* (2013.01); *H02P 2201/00* (2013.01)

(58) Field of Classification Search
CPC ........ H02M 1/00; H02P 1/00; H02P 2101/00; H02P 2201/00
See application file for complete search history.

(56) References Cited

U.S. PATENT DOCUMENTS

| | | | | |
|---|---|---|---|---|
| 4,799,019 A | * | 1/1989 | Cooley | ................ G01R 31/026 324/133 |
| 4,833,451 A | * | 5/1989 | Lehmann | ............. G08B 25/018 340/508 |

(Continued)

FOREIGN PATENT DOCUMENTS

| | | |
|---|---|---|
| EP | 0405247 A1 | 1/1991 |
| EP | 2093737 A1 | 8/2009 |

(Continued)

*Primary Examiner* — Jermele M Hollington
*Assistant Examiner* — Temilade Rhodes-Vivour
(74) *Attorney, Agent, or Firm* — Harness, Dickey & Pierce, P.L.C.

(57) ABSTRACT

A method for measuring a line resistance $R_L$ (7) and determining control line (16) faults in a hazard warning and control system. The control lines (16) connect a control device (20) to an actuator (10) using an actuation voltage $U_A$ in the case of an event and supplies the actuator (10) with a monitoring voltage $U_M$ in the case of a monitoring process using a monitoring module (21). Furthermore, the control device (20) has a constant current sink (6), which can be activated by a microcontroller (1), and a switchover device (5). In order to determine the line resistance $R_L$ (7), a constant voltage supply is provided in a measurement time interval $\Delta t_M$ by an energy store (9) integrated into the monitoring module (21) and is fed back to the control device (20), and the switchover device (5) deactivates the monitoring voltage $U_M$ supply from the control device (20) to the actuator (10) during the entire measurement time interval $\Delta t_M$.

18 Claims, 4 Drawing Sheets

(51) Int. Cl.
*H02P 1/00* (2006.01)
*H02M 1/00* (2006.01)

(56) References Cited

U.S. PATENT DOCUMENTS

| | | | | |
|---|---|---|---|---|
| 6,292,541 B1* | 9/2001 | Tice | ............... | H04B 3/46 |
| | | | | 324/500 |
| 2003/0221668 A1* | 12/2003 | Hashimoto | ........... | F02D 11/105 |
| | | | | 123/396 |
| 2005/0137752 A1* | 6/2005 | Alvarez | ................. | G01D 21/00 |
| | | | | 700/282 |
| 2006/0103527 A1* | 5/2006 | Ben-Asher | ........... | G08B 13/122 |
| | | | | 340/564 |

FOREIGN PATENT DOCUMENTS

| FR | 2932917 A1 | 12/2009 |
|---|---|---|
| WO | 2009/087169 A1 | 7/2009 |

\* cited by examiner

METHOD AND DEVICE FOR MEASURING A LINE RESISTANCE OF CONTROL LINES IN HAZARD WARNING AND CONTROL SYSTEMS

CROSS-REFERENCE TO RELATED APPLICATIONS

This application is a National Stage of International Application No. PCT/EP2014/059550, filed May 9, 2014 (now WO 2014/184107A1), which claims priority to European Application No. 13168203.1, filed May 17, 2013 (now EP 2804163). The entire disclosures of each of the above applications are incorporated herein by reference.

FIELD

The disclosure relates to a method for measuring a line resistance $R_L$ and thus for determining faults of control lines in a hazard warning and control system. Moreover the disclosure relates to a device for measuring a line resistance $R_L$ and thus for determining faults of control lines in a hazard warning and control system.

BACKGROUND

Hazard warning and control systems, such as fire detection systems, and extinguishing control systems with fire detection and/or extinguishing control panels or detection systems with respective control panels present high demands on the reliability and operational safety of the systems, in order for the owners or operators of at-risk industrial units, storage units or other objects to be protected, to be warned in good time before the occurrence of great damage through fire, chemicals, sabotage, intrusion or other hazard scenarios, and/or in order for appropriate countermeasures to be taken, or automatic protection devices or means of alarm to be activated. Of particular importance is the activation of actuators, for example solenoid valves to activate extinguishing systems or actuators such as audible and visual means of alarm, for example flashing beacons and buzzers or actuators in the form of servomotors.

These actuators are activated by control devices of a hazard warning and control system through supply lines and/or signal lines, usually two-wire or multiple-wire lines, wherein in case of an incident an activation voltage $U_A$ conforming to the specifications will be switched to the actuators. The incident can for example be a fire incident, i.e. a burn- or fire detection signal or an intrusion or sabotage signal or another hazard or alarm signal.

Such installations must function reliably and error-free over longer periods of time under various requirements and operating conditions. To this end the supply lines and/or signal lines are continuously monitored to detect functional faults like short-circuits and wire breakages. Such monitored supply lines and/or signal lines are called primary lines or control lines. Hereinafter the term 'control lines' will be used. The monitoring for missing or faulty actuators is also of significance for the reliable operation.

The monitoring of supply lines and/or signal lines for wire breakage and short circuit for example in fire detection systems takes place thus far usually through a low control current that is caused by a resistance $R_{EOL}$ at the end of the line, in particular a fire detection line, that is to be monitored. This monitoring current through the resistance plus the current uptake of the fire detectors on the line make the quiescent current that is continuously monitored by the control panel. If this quiescent current drops below a certain value, the control panel recognizes this as wire breakage on the line and signals this fault. The problem here is that the resistance $R_{EOL}$ is very high in relation to the line resistance, thus a slow developing wire breakage, i.e. the gradual increase of the line resistance by a few ohms, is very difficult to measure by this ratio. However this is a mandatory requirement of standards, for example the EN54 series.

During long term operation of hazard warning and control systems the detection of the so called slow developing wire breakage is of great significance. By slow developing wire breakage a slow, gradual increase of the line resistance of the supply and/or signal lines is understood. Possible causes of this slow, gradual increase of the line resistance are environmental effects, as for example humidity and corrosive gases that lead to the oxidation of the contact points of the wires and the terminal contacts. This slow developing process leads to changes of the quiescent current on the respective lines in the range of approximately 0.1 mA, equivalent to only a 0.1Ω to 10Ω change of the line resistance.

Methods and devices of the aforementioned type are known from the prior art. A method and a device for monitoring a signaling line of a fire alarm system for faults is known from EP 1 855 261 A1, where a line current is applied to the fire alarm control system in operation, having a final element formed by a TVS diode. The line current and/or line voltage is monitored. Faults of the signaling line are detected through a short increase and a short drop of the line current. The evaluation takes place by means of the voltage levels, not the current. The evaluation is performed by the fire detection control panel, where the increase and decrease of the line current also takes place. The fire detection control panel continuously supplies the participants with the required operating voltage or activation voltage.

The disadvantage of this is that the nonlinear and temperature dependent behavior of TVS diodes at the end of the line makes it difficult to determine the absolute value of the line resistance, especially when a resistance increase of only a few Ω is to be determined.

WO 2009/087169 discloses a monitoring device and a method for monitoring the operational state of supply and/or signal lines of a detection system, in particular a fire protection and/or hazard warning system.

The monitoring device comprises a measuring device for generating a measurement signal, an evaluation device and a controllable signal source that is designed to inject a test signal into the supply and/or signal lines. The measurement signal comprises the system response of the supply and/or signal lines to the test signal.

The disadvantage here is that this device and the method is only suitable for relative measurements of the line resistance, and the fault detection, for example the detection of a slow developing wire breakage, always requires a calibration of the system during commissioning, the determined value of the system response is stored and becomes the reference value for the subsequent monitoring measurements. Thus increased line-resistance values on account of faulty installation cannot be detected.

FR 2 932 917 A1 discloses a safety system with an alarm control panel, a bifilar line and a line end module, where the alarm control panel is connected to a first end of the line and the line end module (monitoring module) is connected to a second end of the line, and several peripheral units are parallel-connected between the wires of the line. The alarm control panel of FR 2 932 917 A1 comprises a control unit, current supply means and measuring means, the measuring means being controlled by the control unit so as to detect a possible insulation failure of the line during a first monitoring phase and to detect a possible flux failure of the line during a second monitoring phase.

FR 2 932 917 A1 discloses a device for the detection of faults on the line of the safety system that in monitoring mode supplies the line by means of the current supply means of the alarm control panel with electric energy of inverse polarity, that leaves the peripheral units inactive, and in the monitoring phases injects two distinct defined currents from the alarm control panel into the line. The line end module is capable of assuming two states of impedance that are set through a sensor for detecting a phase change signal and a delay circuit. Furthermore FR 2 932 917 A1 discloses that the line end unit is equipped with an energy storage that is solely designated to supply the active components of the line end unit.

The EP 2 093 737 A1 document discloses an active line terminating module for monitoring a line impedance of electric systems, in particular for the usage at the end of fire detection lines, wherein a constant current sink with light indicator, a voltage regulator and an intelligent electronic component are arranged between the lines that are to be monitored, in such a way that the intelligent electronic component is connected through a line with the constant current sink.

Disadvantages of the prior art are:
the missing or inaccurate absolute determination of the line resistance in the region from mΩ to a few Ω;
previous methods and devices are expensive;
the complexity of monitoring devices with integrated measuring and evaluation devices within the monitoring device that are arranged at the end of a supply and/or signal line, distant from the supplying control panel, with associated environmental factors, makes these monitoring devices susceptible to EMC effects or requires high circuitry expenditures in order to suppress these;
participants on the supply and/or signal line distort the measurement of the line resistance;
during the measurement of the line resistance, voltage fluctuations on the supply and/or signal lines can distort the determination of the line resistance;
missing or inaccurate methods and devices for the measurement of the wire breakage, from slow developing to full wire breakage.

SUMMARY

The disclosure is based on the object of providing an improved method for measuring the line resistance $R_L$ and for determining faults of control lines between a control device and an actuator that eliminates at least one disadvantage of the known prior art.

Furthermore the disclosure is based on the object of providing an improved device for measuring the line resistance $R_L$ and for determining faults of control lines between a control device and an actuator that eliminates at least one disadvantage of the known prior art.

The inventive method overcomes the problem of conventional methods with an end resistance $R_{EOL}$, which is very high in relation to the line resistance $R_L$, and thus minor changes of the line resistance $R_L$ in the range of mΩ to a few Ω are not measurable.

The disclosure relates to a method for measuring a line resistance $R_L$ and thus for determining faults of control lines in a hazard warning and control system. The control lines connect a control device to an actuator that is driven by the control device using an activation voltage $U_A$ in the case of an incident. In the case of monitoring, the control device supplies the actuator with a monitoring voltage $U_M$.

An incident in a preferred embodiment is for example the detection of a fire in a fire detection and extinguishing control system. Then driving the actuator takes place, which is preferably designed as a solenoid valve and releases an extinguishing fluid to extinguish the fire.

The control device exhibits a constant current sink connectable via a microcontroller or a connectable load resistance and a switching device.

The switching device is preferably controlled by the microcontroller and switches voltage sources that are preferably integrated into the control device, onto the control lines.

Furthermore for the execution of the method a monitoring module is used that is arranged at the end of the control lines on the actuator or in the actuator. The beginning of the control lines is arranged on the control device. In the inventive method, for determining the line resistance $R_L$ a constant voltage supply is provided in a measurement time interval $\Delta t_M$ by means of an energy storage integrated into the monitoring module, and KL1 fed back into the control device, and in the entire measurement time interval $\Delta t_M$ the switching device switches off the supply of monitoring voltage $U_M$ provided by the control device for the actuator.

The beginning of the control lines is connected to the corresponding contacts for electrically tying to the control device and the end of the control lines with the actuator and the monitoring module.

The switching off of the actuator is done by the switching device which is controlled by the microcontroller. The actuator and the control lines are thus switched to be de-energized from the side of the control device. In a preferred development of the disclosure only the control lines with the line resistance $R_L$ are connected between the control device and the monitoring module and there are no further resistances or participants in the measuring circuit for determining the line resistance. However, the disclosure is not limited to this embodiment. In another advantageous development there are multiple participants, for example actuators in the measuring circuit.

This method has the advantage that an accurate and absolute determination of the line resistance $R_L$ in the mΩ range to a few Ω is possible. This method excludes the influence of voltage fluctuations and the influence of further participants in the measurement time interval $\Delta t_M$ in which the line resistance $R_L$ is measured.

An advantageous development is characterized in that the following method steps are carried out:
providing a monitoring voltage $U_M$ at the contacts of the control device for electrically tying the control lines for the duration of a time interval $\Delta t_i$,
charging the energy storage of the monitoring module by means of the applied monitoring voltage $U_M$ for the duration of the time interval $\Delta t_1$,
switching off the monitoring voltage $U_M$ after the expiration of the time interval $\Delta t_1$,
generating a regulated voltage $U_0$ from the energy storage preferably PCT2 using a voltage regulator,
measuring a resulting voltage value $U_1$ at the contacts using an A/D converter and storing the voltage value $U_1$ in a memory,
activating the constant current sink by means of the microcontroller and impressing a current value $I_2$ into the control lines, measuring a voltage value $U_2$ using the A/D converter at the contacts, that is generated as a result of KL3 the impressed voltage value $I_2$, storing the voltage value $U_2$ in the memory and calculating the line resistance $R_L$.

Switching on and off and providing the monitoring voltage $U_M$ is done using the switching device that is controlled by means of the microcontroller and switches the corresponding voltage source for the generation of the monitoring voltage $U_M$ onto the control lines.

The switching device is preferably initially in the switch position A, in which the monitoring module is supplied with the monitoring voltage $U_M$. The energy storage is charged to the value of the monitoring voltage, preferably via a rectifier. For determining the line resistance $R_L$ the switching device is switched to switch position B by the microcontroller. Thus the monitoring module is switched off on the side of the control device. The energy storage feeds the voltage back into the control device, preferably using the voltage regulator. There this voltage value is measured and stored using the A/D converter. This value is $U_1$. The rectifier prevents the energy storage from directly discharging into the control line to the control device. Subsequently the microcontroller activates the constant current sink, whose current value $I_2$ is then impressed into the measuring circuit, into the control lines. The energy storage is designed in such a way that the output voltage of the voltage regulator remains constant at least until using the A/D converter the resulting voltage $U_2$ was measured in the control device and stored. The value of the line resistance $R_L$ is then calculated via the microcontroller as follows:

$$R_L = (U_1 - U_2)/I_2$$

In an alternative development of the method the current value $I_2$ is generated by connecting a load resistance. The load resistance is then arranged in the control device instead of the constant current sink and it is connected via the microcontroller.

Another advantageous development of the method is characterized in that the duration of all method steps after the expiration of the time interval $\Delta t_1$ determines the measurement time interval $\Delta t_M$.

In an advantageous development of the method the line resistance $R_L$ is calculated by forming the quotient from the difference of the voltage values $U_1 - U_2$ and the difference of the associated currents $I_2 - I_1$. In a preferred embodiment no current is impressed into the control lines from the side of the control device during the measurement of the voltage value $U_1$, so that $I_1 = 0$ A. This simplifies the method and the device.

As usually the control lines must be monitored continuously, the measurement of the line resistance $R_L$ takes place periodically. Preferred periods are in the range from 1 to 60 seconds, but any discretionary intervals in the region of minutes or hours are possible depending on the project conditions. This monitoring can also take place aperiodically and/or on demand.

In a further development of the method the inventive determination of the absolute value of the line resistance $R_L$ of the control lines is used to signal faults on the control lines. For this, when a predefined limit value for the line resistance $R_L$ is exceeded, the microcontroller generates a fault signal that signals a fault of the control lines, which in a preferred embodiment represents the detection of a slow developing wire breakage.

As the absolute value of the line resistance $R_L$ is being determined by the inventive method, also a faulty installation with increased values of the line resistance $R_L$ of the control lines can be detected as a fault through a measurement of the line resistance after installation The detected faults of the control lines are preferably indicated optically and/or acoustically.

Preferred times and time intervals for the sequence of the inventive method are in the region of 1 to 100 ms for the measuring time interval $\Delta t_M$, particularly preferred the region of 1 ms to 9 ms, and for the time interval $\Delta t_1$ the region of 1 s to 100 s, particularly preferred the region of 5 s to 20 s. However the times and time intervals can be adjusted to the respective requirements using other values.

In an alternative development of the method the measurement of the line resistance $R_L$ can also be combined with the conventional monitoring through a terminating resistance $R_{EOL}$. For this, just as the current technique, a terminating resistance $R_{EOL}$ is additionally arranged in the monitoring module. In case of monitoring, the switching device is in switch position A, this $R_{EOL}$ together with a series resistor of the voltage source for generating the monitoring voltage $U_M$ in the control device and for the internal resistance of the actuator forms a voltage divider. The voltage that thereby ensues in the measuring circuit of the control device is measured with the A/D converter and evaluated by the microcontroller.

The advantage here of this alternative development of the inventive device and the inventive method is that the monitoring current flows through the actuator as well, and thus it is also monitored for wire breakage. The terminating resistance $R_{EOL}$ is designed in such a way that the monitoring voltage cannot cause an unintended activation of the actuator.

At the activation of the actuator the microcontroller switches the switching device into switch position C. In this switch position the actuator is supplied with the activation voltage $U_A$, for example 24V DC. In this advantageous design a limit-value switch that is in addition present in the monitoring module, together with an additionally arranged switch ensures that the terminating resistance is shorted and thus the whole activation voltage $U_A$ is applied to the actuator.

The disclosure furthermore relates to a device for measuring a line resistance $R_L$ and thus for determining faults of control lines in a hazard warning and control system. The device comprises a control device and a monitoring module. The control device exhibits a constant current sink connectable via a microcontroller or a connectable load resistance, a switching device and a voltage source for generating a monitoring voltage $U_M$. The monitoring module is arranged at the end of the control lines at or in an actuator. The beginning of the control lines is arranged at the control device. The monitoring module exhibits an energy storage.

In the case of an incident the control device controls the actuator via the control lines using an activation voltage $U_A$. The inventive device is characterized in that the monitoring module, for determining the line resistance $R_L$, exhibits an energy storage for generating and feeding-back a constant voltage supply into the control device in a measurement time interval $\Delta t_M$ and in that the switching device and the microcontroller are designed and formed such that the supply monitoring voltage $U_M$ provided by the control device for the actuator is switched off in the entire measurement time interval $\Delta t_M$[PCT1].

It is crucial that the device is designed such that the constant voltage, provided by the energy storage of the monitoring module, is fed back into the control device in the measurement time interval $\Delta t_M$.

The beginning of the control lines is electrically connected to the contacts of the control device. The end of the control lines is connected to the terminal contacts on the monitoring module.

Various embodiments can be used for the arrangement of the monitoring module at or in the actuator. In a preferred embodiment the monitoring module is located in a separate housing and is directly attached to the actuator via electrical contact points. It is crucial that there are no further line connections between the monitoring module and the actuator, in which a slow developing wire breakage can occur. In a further preferred embodiment the monitoring module is integrated into the housing of the actuator as a pluggable and replaceable module, wherein the circuit of the actuator exhibits receiving means to plug the module and the electrical contact points. In a particularly preferred embodiment the monitoring module is integrated into the circuit of the actuator and thus constitutes an integrated monitoring module.

The control device is equipped with a constant current sink connectable via a microcontroller, a switching device controlled by a microcontroller, and a voltage source for generating a monitoring voltage $U_M$, an analog-digital converter, A/D converter for short, as well as a memory. Instead of the constant current sink a connectable load resistance can be arranged as well. The switching device is preferably electronic with preferably 3 switch positions, A, B and C. The control device is furthermore equipped with a voltage source for generating the activation voltage $U_A$ of the actuator. In the switch position A of the switching device the monitoring voltage $U_M$ is applied at the contacts at the beginning of the control lines. In switch position B of the switching device there is no voltage at the contacts at the beginning of the control lines, i.e. in this switch position B the voltage supply of the actuator, in particular the monitoring voltage $U_M$, is switched off on the side of the control device.

The memory can be integrated into the microcontroller or into a further microcontroller or microprocessor of the control device, or it can be constructed as a separate component.

The monitoring module exhibits an energy storage for generating a constant voltage supply in a measurement time interval $\Delta t_M$ for determining the line resistance $R_L$. Preferably the monitoring module also exhibits a rectifier and a voltage regulator. In a particularly preferred embodiment this energy storage is an adequately dimensioned capacitor. In a preferred embodiment the value of the capacity of the capacitor is in the region of 1 µF to 1000 µF.

In normal operation, that means in the event of monitoring when no activation of the actuator occurs, this energy storage is charged with a monitoring voltage $U_M$ to a specified voltage. In an advantageous design this voltage is in the range of 2 V to 15 V, in a particularly preferred design it is 10 V. As voltage regulator commercially available regulators are used in the voltage range of 2.5 V to 9 V, preferably a voltage regulator for 3.3 V.

The actual line monitoring then occurs cyclically, for example every 10 s, as follows, what the inventive device is equipped and designed for:

The monitoring voltage $U_M$ of the actuator is switched off on the side of the control device.

The energy storage of the monitoring device supplies then the voltage to which it was charged and feeds it back into the control device.

The control device measures and stores a voltage value $U_1$.

Subsequently the constant current sink is activated with a current value $I_2$, preferably 100 mA. This is also supplied from the energy storage.

In the control device a new voltage measurement takes place with the value $U_2$.

In the development of the monitoring module with a voltage regulator, this is supplied from the energy storage and feeds the regulated voltage back into the control device.

The value of the line resistance $R_L$ is now calculated in the control device according to the following calculation rule: $R_L=(U_1-U_2)/(I_2-I_1)$. The current value $I_1$ is in this design variant equal to zero. Alternatively the measurement can also be performed with two separate constant currents as well.

For example a line resistance of $R_L=1\Omega$ with the values $I_2=100$ mA, $I_1=0$ mA results in the following voltage difference:

$$\Delta U = R_L \cdot (I_2-I_1) = 1\Omega \cdot 100 \text{ mA} = 0.1\text{V}$$

In a preferred design a simple 8 bit A/D converter is used in the control device, that has a 3.3 V converting range. Thus line resistances are detected in 130 mΩ steps with a 13 mV/bit resolution.

An advantageous development of the disclosure is characterized in that the control device is equipped and designed such that the switching device can be controlled by means of the microcontroller, for switching on and off the voltage supply of the actuator, preferably the monitoring voltage $U_M$, and/or for driving the actuator using a drive voltage $U_A$ in the event of an incident.

A further advantageous development of the disclosure is characterized in that the control device is designed for periodically and/or aperiodically measuring the line resistance $R_L$ and/or for measuring on demand.

An additional preferred development of the disclosure envisages that the monitoring module exhibits a terminating resistance $R_{EOL}$ connected in series to an inside resistance of the actuator, a limit-value switch and a switch, the terminating resistance $R_{EOL}$ being designed such that the voltage applied to the actuator is below the minimum drive voltage $U_A$ when the monitoring voltage $U_M$ is applied.

In this further development of the inventive device, in the event of monitoring (switching device in switch position A) the terminating resistance $R_{EOL}$ together with a series resistor or the internal resistance of the voltage source for generating the monitoring voltage $U_M$ in the control device and the internal resistance of the actuator form a voltage divider. The control device is here designed such that upon applying the monitoring voltage the voltage, that ensues at the contacts for electrically tying the control lines to the control device, can be measured using the A/D converter and evaluated by the microcontroller. The advantage with this design is that the monitoring current flows through the actuator as well, and thus it likewise is monitored for wire breakage.

The terminating resistance $R_{EOL}$ is here designed in such a way that the monitoring voltage $U_M$ cannot cause an unintended activation of the actuator, the voltage applied to the actuator is here below the minimum activation voltage of the actuator. In this design version the control device is designed such that in the event of an incident upon the activation of the actuator with the activation voltage $U_A$ the microcontroller activates the switching device and switches the activation voltage $U_A$ onto the contacts for electrically tying the control lines to the control device. The limit-value switch together with the switch ensures that the terminal resistance $R_{EOL}$ is shorted and thus the whole activation voltage $U_A$ is applied to the actuator.

A further advantageous development of the inventive device is characterized in that the control device is set up and designed such that when a predefined limit value for the line resistance $R_L$ is exceeded the microcontroller generates a fault signal that signals a fault of the control lines.

In a preferred development optical and/or acoustical indicators are activated by the fault signal, therefore the control device is designed to generate one or more fault messages.

The energy storage of the inventive device is preferably designed as a capacitor. This is charged through applying the monitoring resistance $U_M$ from the side of the control device. This capacitor supplies a constant voltage supply via a voltage regulator for the measurement of the line resistance $R_L$. In further advantageous developments the energy storage is designed as a battery or as an accumulator. All embodiments of the energy storage are dimensioned such that they ensure a constant voltage supply during the entire measurement time interval $\Delta t_M$ for the measurement of the line resistance $R_L$.

In a preferred development the hazard warning and control system represents a fire detection system and/or extinguishing control system.

An incident in this case is the detection of a fire via fire detectors of the fire detection system. The extinguishing control system is preferably designed as a fire detection panel and/or extinguishing control panel with actuators to be activated. One embodiment of the actuator is a solenoid valve. The triggering of the solenoid valve via the control lines by applying the activation voltage $U_A$ in the event of an incident releases an extinguishing fluid for the extinguishing of the fire. To ensure this important function, this preferred development of the inventive device measures the line resistance $R_L$ of the control lines and monitors these for faults. In this preferred development variant it is advantageous that the control device is designed as constituent part of a fire detection panel and/or extinguishing control panel.

This is preferably achieved by the control device representing a control group module of the fire detection panel and/or extinguishing control panel or being designed as a ring bus participant. Also the design of the control device as a ring bus participant module represents a development variant.

The control group module controls actuators as for example solenoid valves or signal generators, acoustical or optical, control solenoids, contactor coils, motors or similar units. The actuator or actuators are connected to the control group module via control lines, by which the required operating voltage or the activation voltage $U_A$ is supplied for the function and activation of the respective actuator in the event of activation. The event of activation is an event of incident, such as fire detection or pre-warning or another incident.

The control lines to the actuator are monitored for wire breakage and short circuit through the measurement of the line resistance $R_L$. The monitoring preferably additionally includes the availability and orderly condition of the connected actuators.

Upon detecting a fire a corresponding function module of the fire detection control panel receives the signal of a fire detector, thereupon a command is sent to the control group module through a central computing unit of the fire detection control panel, which then switches a solenoid valve on an extinguishing device and with this releases an extinguishing fluid that reaches the fire through nozzles.

The control group module and the ring bus participant module are each equipped with at least one programmable microcontroller, memory, A/D converter and at least one electronic switching circuit or measuring circuit for the monitoring of control lines and/or signal lines for wire breakage and short circuit.

The ring bus module is connected to at least one participant loop. Individually addressable participants, so called ring bus participants, are connected via a connection line, a signal line that ensures both the energy supply and the data transfer. Ring bus participants are for example external switch or transmitter elements, fire detectors, hazard detectors, actuators and control devices, that are designed as an addressable module. With the ring bus technology the signal line is designed as a closed ring bus line in an advantageous design. This has the advantage that when this signal line is interrupted, for example by wire breakage, the energy supply and the communication with the addressable participants from both sides of the former ring are ensured via the ring bus participant module. In another design this signal line is designed as a spur line for ring bus participants.

In a further alternative design the control device represents an addressable module.

In a further form of the device this addressable module is designed as a participant on a ring bus line of the fire detection panel and/or extinguishing control panel and represents a ring bus participant.

In an advantageous design the data communication between the ring bus participant module and the ring bus participants occurs via the signal lines and via a data transfer control, preferably in bit-serial form and in the half-duplex mode. Here the data information is modulated onto the supply voltage that is provided by the ring bus participant module.

The circuit of the flat module of the ring bus participant module and the programming of the associated processor of this module are set up and designed such that the signal lines are examined continuously or at regular intervals for wire breakage and short circuit. When a wire breakage or short circuit is detected, this is sent to the central control unit via the bus connection, the incident is stored in the memory and the central control unit controls the display of the wire breakage or short circuit on the display and operating unit.

A further subject matter of the disclosure is a fire detection and/or extinguishing control panel with a device for measuring a line resistance $R_L$ and thus for determining faults of control lines in a hazard warning and control system.

The device exhibits a control device, in which a constant current sink connectable via a microcontroller, or a connectable load resistance, a switching device and a voltage source for generating a monitoring voltage $U_M$ are arranged, as well as a monitoring module. The monitoring module is arranged at the end of the control lines at or in an actuator, wherein the beginning of the control lines is arranged at the control device. The extinguishing control panel is in particular characterized in that the monitoring module exhibits an energy storage for generating and feeding-back a constant voltage supply into the control device in a measurement time interval $\Delta t_M$ for determining the line resistance $R_L$ and that the switching device and the microcontroller are designed and formed such that the voltage supply of the actuator is switched off in the entire measurement time interval $\Delta t_M$ on the side of the control device.

Advantageous developments of the inventive extinguishing control panel include a device for measuring a line resistance $R_L$ and thus for determining faults of control lines.

A further subject matter of the disclosure is a method for monitoring of extinguishing systems, in particular for determining faults of control lines through measuring a line resistance $R_L$.

The control lines connect a control device to an actuator and the control device in the case of an incident activates the actuator using an activation voltage $U_A$ and in the case of monitoring supplies the actuator with a monitoring voltage $U_M$. At or in the actuator a monitoring module is arranged at the end of the control lines, wherein the control device furthermore exhibits a constant current sink connectable via a microcontroller, or a connectable load resistance and a switching device and the beginning of the control lines is arranged on the control device. The method is in particular characterized in that for determining the line resistance $R_L$ a constant voltage supply is provided in a measurement time interval $\Delta t_M$ by means of an energy storage integrated into the monitoring module and is fed back into the control device and in the entire measurement time interval $\Delta t_M$ the switching device switches off the voltage supply of the actuator with the monitoring voltage $U_M$ on the side of the control device.

Advantageous developments of the inventive method for monitoring extinguishing systems use the method for measuring the line resistance $R_L$ and thus for determining faults of control lines in an.

The inventive method and the inventive device result in a number of advantages:

- With the proposed method the line resistance $R_L$ can be detected in the milliohm (m$\Omega$) range. If for example a current sink of 100 mA is used, a measured voltage difference of 100 mV corresponds to a line resistance of 1$\Omega$. Thus values in the order of magnitude of 10 m$\Omega$ can be resolved with an inexpensive 8 bit A/D converter. The requirement for the detection of slow developing wire breakages, for example in the EN54 series of standards, can be fulfilled cost-effectively and with little expense.
- The device and the method are cost effective, because in comparison to the current technology only few components are added. The evaluation circuit is arranged in the control device. The components that are necessary for measuring the voltage and the microcontroller of the control device, which is necessary for the evaluation, can be used.
- The inventive method is compatible with the currently used technology. In an advantageous design the monitoring module is designed such that it can replace old modules on or in actuators by substitution.
- The line resistance $R_L$ is measured as an absolute resistance value and it can be displayed.
- The low complexity of the monitoring module, with few components, which is arranged at the end of a supply and/or signal line, a control line and exposed to relevant environmental factors, makes the inventive devices less susceptible with respect to EMC influences.
- The inventive method ensures that during the measurement of the line resistance no voltage fluctuations on the supply and/or signal lines distort the determination of the line resistance.

DRAWINGS

Further advantageous or convenient features and developments of the disclosure derive from the sub claims as well as the description. Preferred and advantageous embodiments are illustrated in the attached drawings. In the drawings:

DETAILED DESCRIPTION

Figure 1:
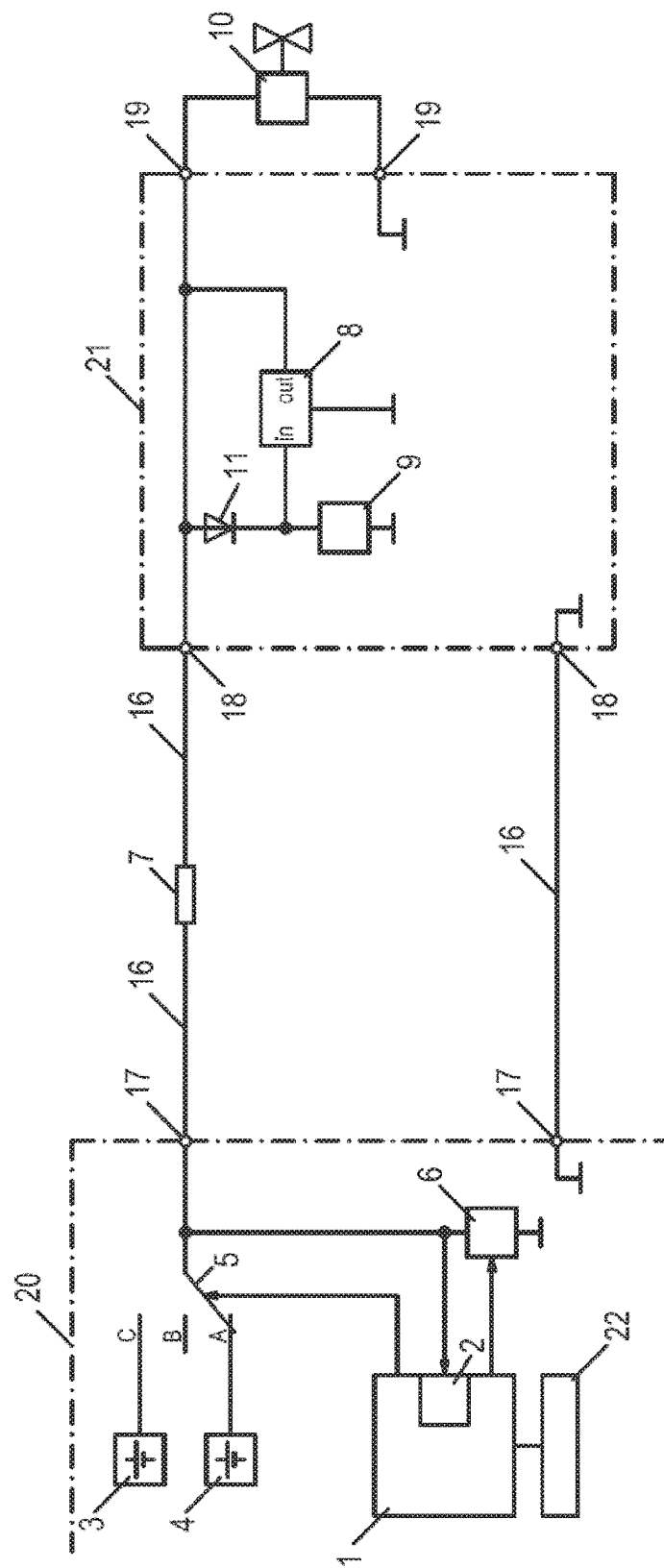
FIG. 1 illustrates a schematic block diagram of the device for the measurement of the line resistance $R_L$.

A particularly preferred development of the device for measuring a line resistance $R_L$ 7 and thus for determining faults of control lines 16 in a hazard warning and control system is illustrated schematically in FIG. 1. The device comprises two functional parts, the control device 20 and the monitoring module 21, which is arranged at the end of the control lines 16 at or in an actuator 10, wherein the beginning of the control lines 16 is arranged at the contacts 17 at the control device 20. The end of the control lines is connected to the monitoring module 21 at the connecting contacts 18.

Various embodiments are used for the arrangement of the monitoring module 21 at or in the actuator 10, which are not illustrated. In a preferred embodiment the monitoring module 21 is located in a separate housing and is directly attached to the actuator 10 via the electrical contact points 19. It is crucial that there are no further line connections between the monitoring module 21 and the actuator 10 in which a slow developing wire breakage can occur. In a further preferred embodiment the monitoring module 21 is integrated into the housing of the actuator 10 as a pluggable and replaceable module, wherein the circuit of the actuator 10 exhibits receiving means to plug the module and the electrical contact points 19. In a particularly preferred embodiment the monitoring module 21 is integrated into the circuit of the actuator 10 and thus constitutes an integrated monitoring module 21. Both for the design variant of the monitoring module 21 as a replaceable module and as an integrated monitoring module 21 the terminal contacts 18 are located on or in the housing of the actuator 10.

The control device 20 exhibits a constant current sink 6 connectable via a microcontroller 1, a switching device 5 and a voltage source 4 for generating a monitoring voltage $U_M$. Instead of the constant current sink 6 a connectable load resistance can be arranged as well. A switching device 5, preferably an electronic one with three switch positions A, B and C, and a memory 22 are furthermore arranged in the control device 20. The control device 20 is also equipped with a voltage source 3 for generating the activation voltage $U_A$ of the actuator 10. In switch position A of the switching device 5 the monitoring voltage $U_M$ is applied at the contacts 17, at the beginning of the control lines 16. In switch position B of the switching device 5 there is no voltage at the contacts 17, at the beginning of the control lines 16, i.e. the voltage supply of the actuator 10 is switched off on the side of the control device 20.

The memory 22 can be integrated into the microcontroller 1 or in a further microcontroller or microprocessor of the control device 20, or, as presented, it can be designed as a separate component.

As illustrated in FIG. 1, the monitoring module 21 exhibits an energy storage 9 for generating a constant voltage supply in a measurement time interval $\Delta t_M$ for determining the line resistance $R_L$ 7. In a particularly preferred embodiment this energy storage 9 is an adequately dimensioned capacitor.

The switching device 5 and the microcontroller 1 are designed and formed such that the voltage supply of the actuator 10 is switched off in the entire measurement time interval $\Delta t_M$ on the side of the control device 20. For this purpose appropriate software is implemented in the microcontroller 1. Here the switching device 5 has switch position B, shown in FIG. 1.

The control device 20 is set up and designed such that the switching device 5 can be controlled by means of the microcontroller 1, for switching on and off the voltage supply, in particular the monitoring voltage of the actuator 10 and/or for activating the actuator 10 using an activation voltage $U_A$ in the event of an incident. For providing the activation voltage $U_A$ the switching device 5 is switched to switch position C.

Through the software implemented in the microcontroller 1, the control device 20 is designed such that the line resistance $R_L$ 7 is measured periodically and/or aperiodically and/or on demand.

Figure 2:
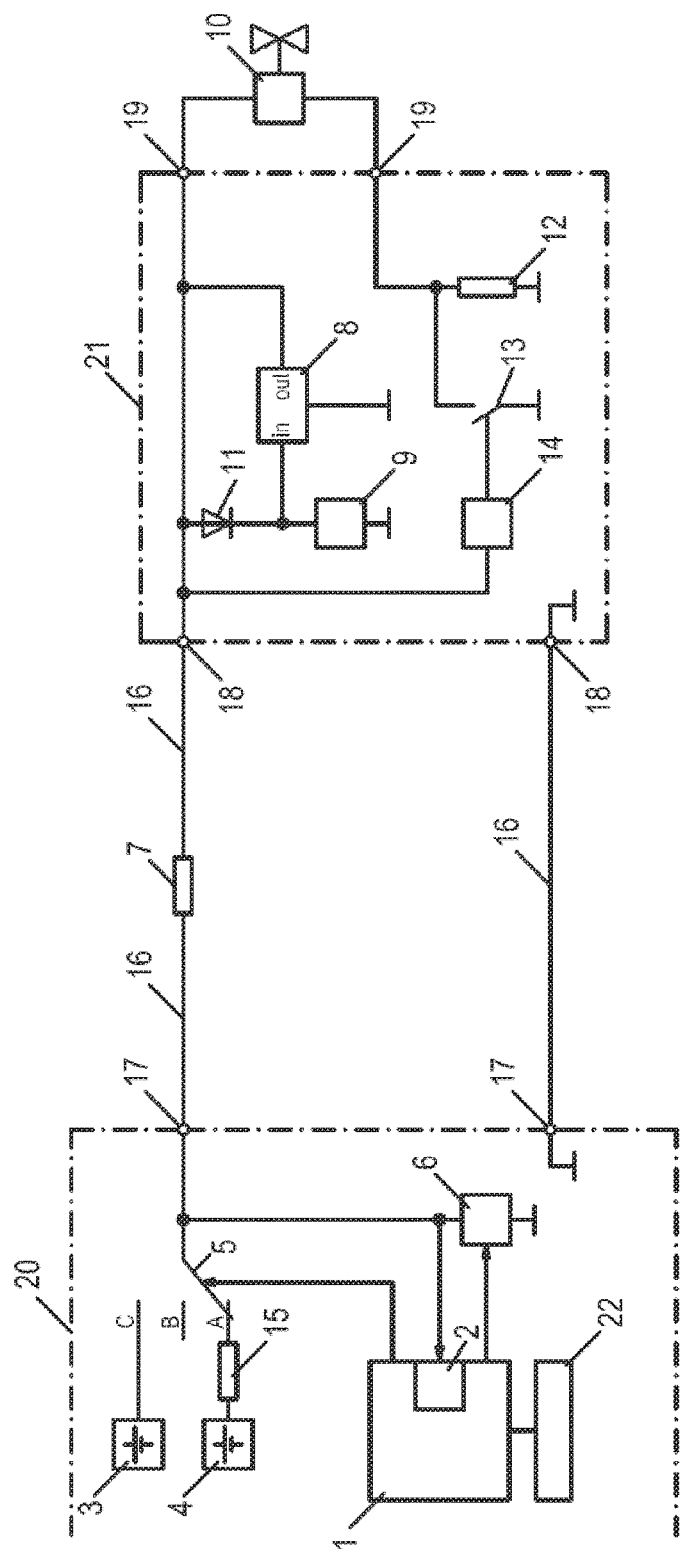
FIG. 2 illustrates a schematic block diagram of a second exemplary embodiment.

An alternative development of the inventive device for measuring the line resistance $R_L$ 7 is schematically illustrated in FIG. 2. In the monitoring module 21 a terminating resistance $R_{EOL}$ 12, connected in series to the internal resistance of the actuator 10, is additionally arranged. In the illustrated case of monitoring, the switching device 5 is in switch position A for providing the monitoring voltage $U_M$ and the terminating resistance $R_{EOL}$ 12 together with a series resistor 15 of the voltage source 4 for generating the monitoring voltage $U_M$ in the control device 20 and the internal resistance of the actuator 10 form a voltage divider. The voltage that thereby ensues in the measuring circuit of the control device 20 is measured with the A/D converter 2 and evaluated by the microcontroller 1.

In both design variants of the inventive device from FIG. 1 and FIG. 2 the microcontroller 1 switches the switching device 5 into switch position C at the activation of the actuator 10 in the event of an incident. The actuator 10 is here supplied with the activation voltage $U_A$, for example 24V DC.

In the design variant that is presented in FIG. 2 a limit-value switch 14 that is additionally arranged in the monitoring module 21, together with an additionally arranged switch 13 ensures that the terminating resistance $R_{EOL}$ 12 is shorted and thus at activation in the event of an incident the whole activation voltage $U_A$ is applied to the actuator 10.

Figure 3:
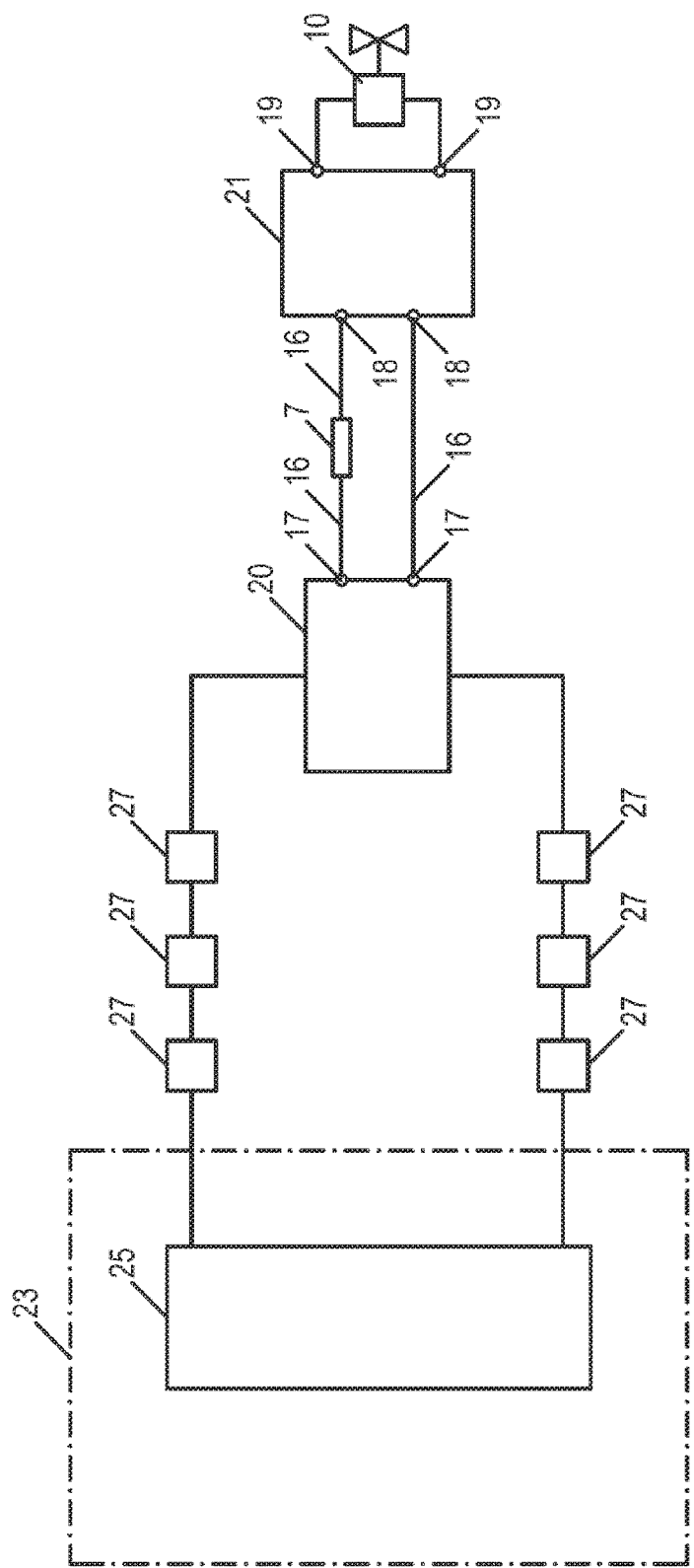
FIG. 3 illustrates a schematic representation of the control device as a control group module of a fire detection and/or extinguishing control panel.

A further design variant of the inventive device is presented in FIG. 3. The control device 20 is designed here as an addressable module on a ring bus line of the fire detection panel and/or extinguishing control panel 23. The ring bus line is connected to the ring bus participant module 25 as for supply and signaling, which is preferably arranged in the fire detection panel and/or extinguishing control panel 23. Further addressable ring bus participants 27, preferably fire detectors, are arranged on this ring bus line. Thus the control device 20, designed as an addressable module, is itself a ring bus participant 27. This has the advantage that an address is assigned to fault messages of a detected slow developing wire breakage and thus the fault message is associated with a defined control line in the building at a particular place.

Figure 4:
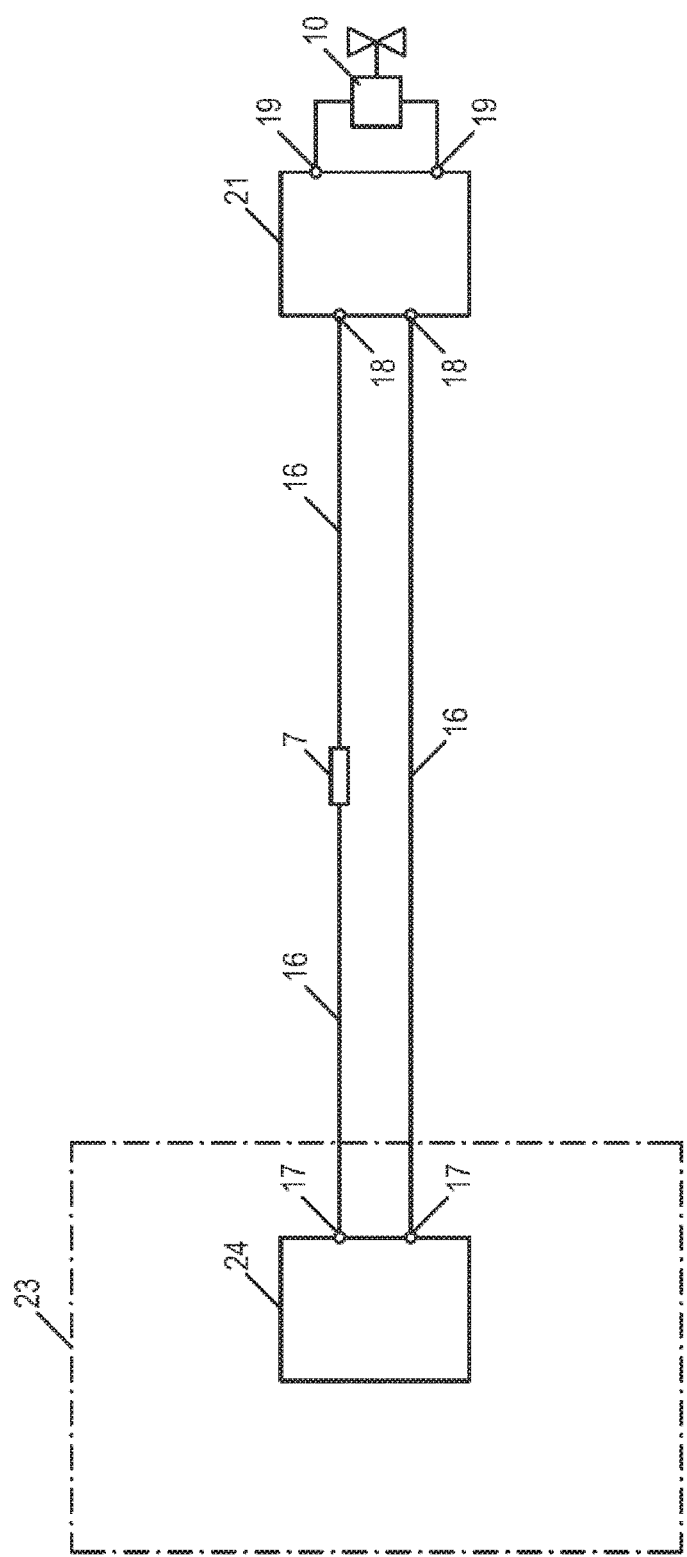
FIG. 4 illustrates a schematic representation of the control device as an addressable module on a ring bus line of a fire detection and/or extinguishing control panel.

In FIG. 4 a further advantageous design of the inventive device is schematically presented. The control device 20 represents here a control group module 24 of a fire detection panel and/or extinguishing control panel 23 and thus is designed as a component of a fire detection panel and/or extinguishing control panel 23.

The presentation of the functional elements of the inventive device in FIG. 1 now illustrates the inventive method in a particularly preferred design.

In switch position A of the switching device 5 in normal operation, that means in the case of monitoring when no activation of the actuator 10 occurs in the event of an incident, the energy storage 9 of the monitoring device 21 is charged with a monitoring voltage $U_M$ to a specific voltage. This monitoring voltage $U_M$ is provided by the voltage source 4. The measurement of the line resistance $R_L$ 7 and thus the line monitoring for faults takes place preferably periodically:

The monitoring voltage $U_M$ of the actuator 10 is switched off on the side of the control device 20, through switching the switching device 5 into switch position B. The switching device 5 remains in this switch position B during the entire measurement time interval $\Delta t_M$. In this measurement time interval $\Delta t_M$ the voltages $U_1$ and $U_2$ are measured.

The voltage regulator 8 of the monitoring module 21 is now supplied from the energy storage 9 and feeds the regulated constant voltage back into the control device 20. This voltage value $U_1$ is measured by the control device 20 using the A/D converter 2 and the microcontroller 1 and is stored in the memory 22.

Subsequently the constant current sink 6 is triggered with a current value $I_2$. This constant current sink 6, too, is supplied by the energy storage 9 and the voltage regulator 8.

Then a new voltage measurement is done with the value $U_2$ in the control device 20 and the microcontroller 1 calculates the line resistance $R_L$ 7 according to a predefined calculation rule.

The method for measuring a line resistance $R_L$ 7 and thus for determining faults of control lines 16 in a hazard warning and control system is characterized in particular in that for determining the line resistance $R_L$ 7 a constant voltage supply is being provided in a measurement time interval $\Delta t_M$ by means of an energy storage 9 integrated into the monitoring module 21 and in the entire measurement time interval $\Delta t_M$ the switching device 5 switches off the voltage supply of the actuator 10 on the side of the control device 20.

In detail the following substantial method steps are carried out:

providing a monitoring voltage $U_M$ at the contacts 17 of the control device 20 for electrically tying the control lines 16 for the duration of a time interval $\Delta t_1$, charging the energy storage 9 of the monitoring module 21 by means of the applied monitoring voltage $U_M$ for the duration of the time interval $\Delta t_1$, switching off the monitoring voltage $U_M$ after the expiration of the time interval $\Delta t_1$, generating a regulated voltage $U_0$ from the energy storage 9 using a voltage regulator 8, measuring a resulting voltage value $U_1$ at the contacts 17 using an A/D converter 2 and storing the voltage value $U_1$ in a memory 22, activating the constant current sink 6 by means of the microcontroller 1 and impressing a current value $I_2$ into the control lines 16, measuring a voltage value $U_2$ using the A/D converter 2 at the contacts 17, that is generated as a result of KL5 the impressed voltage value $I_2$, storing the voltage value $U_2$ in the memory 22, and calculating the line resistance $R_L$ 7.

Providing the monitoring voltage $U_M$ preferably takes place by switching the switching device 5.

This inventive method can be carried out preferably with all development variants of the inventive device that are presented in FIGS. 1 to 4, but it is not limited to these devices.

LIST OF REFERENCE SYMBOLS 1. microcontroller
2. A/D converter
3. voltage source for generating the activation voltage $U_A$ of the actuator 10
4. voltage source for generating the monitoring voltage $U_M$
5. switching device
6. constant current sink
7. line resistance $R_L$
8. voltage regulator
9. energy storage
10. actuator
11. rectifier
12. terminating resistance $R_{EOL}$
13. switch
14. limit-value switch
15. series resistor
16. control lines
17. contacts for connecting the control lines to the central control device 20
18. terminal contacts on the monitoring module 21 for the control lines 16
19. electrical connection points of the monitoring module 21 with the actuator 10
20. control device
21. monitoring module
22. memory
23. fire detection and/or extinguishing control panel
24. control group module
25. ring bus participant module
26. ring bus participant

The invention claimed is:

1. A method for measuring a line resistance $R_L$ (7) and thus for determining faults of control lines (16) in a hazard warning and control system, the control lines (16) connecting a control device (20) to an actuator (10), the control device (20) in the case of an incident driving the actuator (10) using a drive voltage $U_A$ and in the case of monitoring supplying the actuator (10) with a monitoring voltage $U_M$, there being arranged at or in the actuator (10) a monitoring module (21) at the end of the control lines (16), the control device (20) furthermore exhibiting a constant current sink (6) connectable via a microcontroller (1) or a connectable load resistance and a switching device (5) and the beginning of the control lines (16) being arranged on the control device (20), wherein for determining the line resistance $R_L$ (7) a constant voltage supply is provided in a measurement time interval $\Delta t_M$ by means of an energy storage (9) integrated into the monitoring module (21), and fed back into the control device (20), and in the entire measurement time interval $\Delta t_M$ the switching device (5) switches off the supply of monitoring voltage $U_M$ provided by the control device (20) for the actuator (10).

2. The method according to claim 1, wherein the following method steps are carried out:

providing a monitoring voltage $U_M$ at the contacts (17) of the control device (20) for electrically tying the control lines (16) for the duration of a time interval $\Delta t_1$, charging the energy storage (9) of the monitoring module (21) by means of the applied monitoring voltage $U_M$ for the duration of the time interval $\Delta t_1$, switching off the monitoring voltage $U_M$ after the expiration of the time interval $\Delta t_1$, generating a regulated voltage $U_0$ from the energy storage (9) using a voltage regulator (8), measuring a resulting voltage value $U_1$ at the contacts (17) using an A/D converter (2) and storing the voltage value $U_1$ in a memory (22), driving the constant current sink (6) by means of the microcontroller (1) and impressing a current value $I_2$ into the control lines (16), measuring a voltage value $U_2$ using the A/D converter (2) at the contacts (17), that is generated by the impressed current value $I_2$, storing the voltage value $U_2$ in the memory (22) and calculating the line resistance $R_L$ (7), the duration of all method steps after the expiration of the time interval $\Delta t_1$ determining the measurement time interval $\Delta t_M$.

3. The method according to claim 2, wherein the line resistance $R_L$ (7) is calculated by forming the quotient from the difference of the voltage values $U_1$ and $U_2$ and the difference of the associated currents.

4. The method according to claim 1, wherein measurement of the line resistance $R_L$ (7) takes place periodically, aperiodically and/or on demand.

5. The method according to claim 1, wherein when a predefined limit value for the line resistance $R_L$ (7) is exceeded, the microcontroller (1) generates a fault signal that signals a fault of the control lines (16).

6. The method according to claim 5, wherein a slow developing wire breakage is detected as a fault of the control lines (16).

7. The method according to claim 5, wherein faulty installation with increased values of the line resistance $R_L$ (7) of the control lines (16) is detected as fault of the control lines (16).

8. The method according to claim 5, wherein the fault of the control lines (16) is indicated optically and/or acoustically.

9. A device for measuring a line resistance $R_L$ (7) and thus for determining faults of control lines (16) in a hazard warning and control system, comprising:

a control device (20) that exhibits a constant current sink (6) connectable via a microcontroller (1) or a connectable load resistance, a switching device (5) and a voltage source (4) for generating a monitoring voltage $U_M$, and a monitoring module (21) that is arranged at the end of the control lines (16) at or in an actuator (10), the beginning of the control lines (16) being arranged at the control device (20), wherein the monitoring module (21) exhibits an energy storage (9) for generating and feeding-back a constant voltage supply into the control device (20) in a measurement time interval $\Delta t_M$ for determining the line resistance $R_L$ (7), and the switching device (5) and the microcontroller (1) is designed and formed such that the supply of monitoring voltage $U_M$ provided by the control device (20) for the actuator (10), is switched off in the entire measurement time interval $\Delta t_M$.

10. The device according to claim 9, wherein the control device (20) is set up and designed such that the switching device (5) can be controlled by means of the microcontroller (1), for switching on and off the voltage supply of the actuator (10), preferably the monitoring voltage $U_M$, and/or for driving the actuator (10) using a drive voltage $U_A$ in the event of an incident.

11. The device according to claim 9, wherein the control device (20) is designed for periodically and/or aperiodically measuring the line resistance $R_L$ (7) and/or for measuring on demand.

12. The device according to claim 9, wherein the monitoring module (21) exhibits a terminating resistance $R_{EOL}$ (12) connected in series to an inside resistance of the actuator (10), a limit-value switch (14) and a switch (13), the terminating resistance $R_{EOL}$ being designed such that the voltage applied to the actuator (10) is below the minimum drive voltage when the monitoring voltage $U_M$ is applied.

13. The device according to claim 9, wherein the control device (20) is set up and designed such that when a predefined limit value for the line resistance $R_L$ (7) is exceeded the microcontroller (1) generates a fault signal that signals a fault of the control lines (16).

14. The device according to claim 9, wherein the energy storage (9) represents a capacitor or a battery that are dimensioned such that they ensure a constant voltage supply during the measurement time interval $\Delta t_M$.

15. The device according to claim 9, wherein the actuator (10) represents a solenoid valve.

16. The device according to claim 9, wherein the control device (20) is designed as constituent part of a fire detection panel and/or extinguishing control panel (23).

17. The device according to claim 16, wherein the control device (20) represents a control group module (24) or a ring bus participant module.

18. The device according to claim 9, wherein the control device (20) is designed as an addressable module.

* * * * *